United States Patent
Mühsam

(10) Patent No.: US 9,839,153 B2
(45) Date of Patent: Dec. 5, 2017

(54) ASSEMBLY HAVING A RACK SERVER INSERT

(71) Applicant: FUJITSU LIMITED, Kawasaki-shi, Kanagawa (JP)

(72) Inventor: Gerhard Mühsam, Königsbrunn (DE)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/241,346

(22) Filed: Aug. 19, 2016

(65) Prior Publication Data

US 2017/0055361 A1    Feb. 23, 2017

(30) Foreign Application Priority Data

Aug. 21, 2015   (DE) ................. 10 2015 113 918

(51) Int. Cl.
  *H05K 7/20*   (2006.01)
  *H05K 7/14*   (2006.01)

(52) U.S. Cl.
  CPC ................. *H05K 7/1489* (2013.01)

(58) Field of Classification Search
  CPC ... H05K 7/1487; H05K 7/1488; H05K 7/1489
  See application file for complete search history.

(56) References Cited

U.S. PATENT DOCUMENTS

| | | | | |
|---|---|---|---|---|
| 5,570,943 A * | 11/1996 | Schroder | ............ | A47B 88/493 312/334.11 |
| 6,347,849 B1 * | 2/2002 | Muterthies | ............ | A47B 88/487 312/334.1 |
| 6,834,923 B2 * | 12/2004 | Young | ............ | A47B 88/483 312/334.1 |
| 8,226,181 B2 * | 7/2012 | Du | ............ | H05K 7/1489 211/26 |
| 8,289,696 B2 * | 10/2012 | Peng | ............ | G06F 1/187 361/679.39 |
| 2006/0273705 A1 * | 12/2006 | Yeh | ............ | A47B 88/493 312/334.31 |
| 2008/0036347 A1 * | 2/2008 | Liang | ............ | A47B 88/40 312/334.5 |
| 2010/0026154 A1 * | 2/2010 | Johansson | ............ | A47B 88/10 312/334.9 |
| 2011/0058339 A1 | 3/2011 | Le et al. | | |
| 2011/0109214 A1 * | 5/2011 | Lam | ............ | A47B 88/493 312/334.18 |
| 2011/0187253 A1 * | 8/2011 | Jaehrling | ............ | C10M 103/06 312/334.1 |
| 2014/0265790 A1 * | 9/2014 | Hashemi | ............ | F16C 29/048 312/334.8 |
| 2015/0245709 A1 * | 9/2015 | Iwamoto | ............ | H05K 7/1489 211/175 |

* cited by examiner

*Primary Examiner* — Anthony Q Edwards
(74) *Attorney, Agent, or Firm* — Fujitsu Patent Center

(57) ABSTRACT

The invention relates to an assembly comprising a rack server insert and a server rack for accommodating multiple rack server inserts. A rack installation carrier for supporting the rack server insert in the server rack is set up to be supported by telescopic rails. Two holders each with a first rail and a second rail are included in the rack installation carrier. The first rails are fixed to the rack server insert. The second rails are fixed to the server rack. The first rails freely and directly rest on the second rails so that the rack server insert is supported in the server rack.

11 Claims, 5 Drawing Sheets

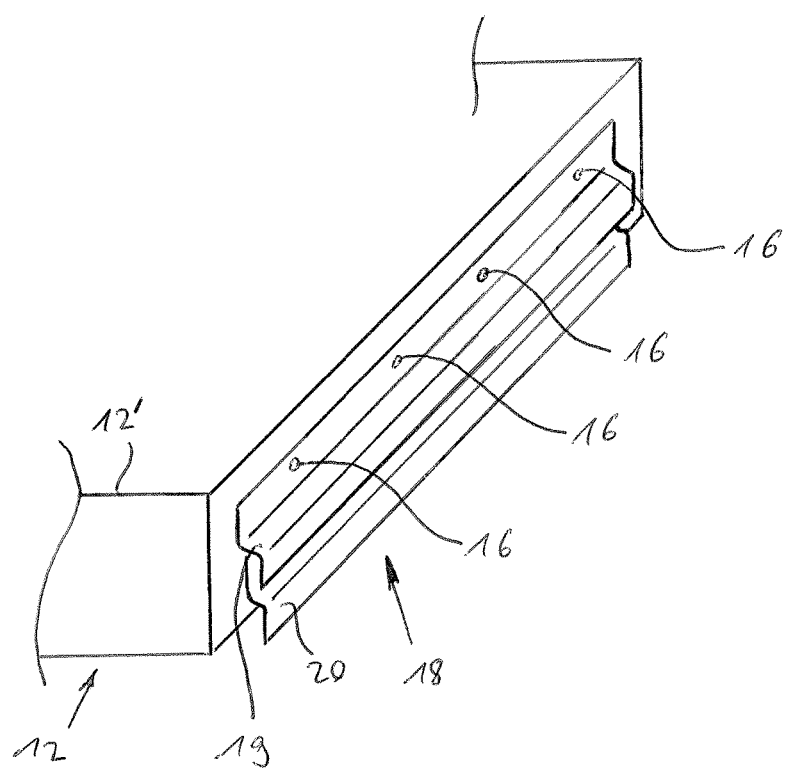

ASSEMBLY HAVING A RACK SERVER INSERT

CROSS REFERENCE TO RELATED APPLICATIONS

This application claims the benefit of priority from German Patent Application No. 102015113918.9, filed Aug. 21, 2015, which is herein incorporated by reference in its entirety.

BACKGROUND

1. Technical Field

Embodiments of the present invention relate to an assembly having a rack server insert, a server rack for accommodating multiple rack server inserts and a rack installation carrier.

2. Background

Server racks allow arranging multiple rack server inserts one over the other in a space-saving manner.

FIG. 1 shows a schematic illustration of a part of a server rack 10. Installation spaces are provided in the server rack 10. An installation space serves for accommodating a rack server insert and a holder thereof. The server rack comprises multiple installation spaces with the height of a height unit 11. An installation space having the height of an integral multiple of the height unit 11 is provided in the lower region of server rack 10. An installation space is the part of the installation site that encompasses the width of the rack server insert. Thus, the installation space of an installation site with a height unit 11 is as high as one height unit 11 and as wide as the rack server insert. There is room for the holder of the rackserver insert between the installation space and inner sides of the server rack.

FIGS. 2 and 3 show schematic illustrations of a rack server insert 12 with various mountings in a server rack 10.

According to the known configuration of FIG. 2, a rack server insert 12 13 is mounted in a server rack 10 with telescopic rails. Here, the telescopic rails 13 are in each case mounted on a first side 14 and on a second side 15 of the rack server insert 12 as well as on inner sides 10' of the server rack 10. Screw connections are provided on holding points 16 for fixing the telescopic rails 13 on the rack server insert 12.

The rack server insert 12 can be pulled out of the server rack 10 and inserted into the server rack 10 via the telescopic rails 13. A chassis 12' of the rack server insert 12 may utilize the entire height of height unit 11.

Another known mounting device of a rack server insert 12 in a server rack 10 is depicted in FIG. 3. Just as well, the installation site in server rack 10 has an installation height of one height unit 11. In the known arrangement according to FIG. 3, the rack server insert 12 rests on L-angles 17. The L-angles 17 are fixed to server rack 10. L-angles 17 have a material thickness 11' and protrude into the installation space. Thus, the chassis 12" of the rack server insert 12 has a height 11" less than the height unit 11 by at least the material thickness 11'. As a result, less space for installation components is available in rack server insert 12.

SUMMARY

At least one embodiment of the present invention provides an alternative arrangement of a rack server insert in a server rack.

The object is achieved by an assembly having a rack server insert, a server rack for accommodating multiple rack server inserts and a rack installation carrier. The rack installation carrier serves for supporting the rack server insert in the server rack. The rack server insert is adapted to be supported in the server rack by means of telescopic rails. The rack installation carrier comprises two holders each having a first rail which is fixed to the rack server insert and each having a second rail which is fixed to the server rack. The first rails freely and directly rest on the second rails. As a result, the rack server insert is supported in the server rack.

It is to be understood that both the foregoing summary description and the following detailed description are explanatory as to some embodiments of the present invention, and not restrictive of the present invention as claimed.

The construction of the rack installation carrier having holders with in each case a first rail and a second rail is particularly characterized by easy installation and low production costs. In this case, the rack installation carrier replaces two telescopic rails that could be used to fix the rack server insert within the server rack.

The first rails directly, i.e. in particular without additional slide rails, roller bearings or other support elements, rest on the second rails. Here, the first rails freely rest on the second rails. This means for the rack server insert to be freely displaceable in an extension direction of the first and second rails. Furthermore, the rack server insert can be lifted out of the second rails. The rack installation carrier is free in the extension direction of the first as well as the second rails and additionally free in a spatial direction that counteracts gravity.

According to an advantageous embodiment, a total height of a first rail laid onto a second rail together with a second rail is less than a height unit of a server rack. Height of the height unit is maintained. Thus, the chassis of the rack server insert may utilize the maximum height of the height unit. Here, the direction of the height is determined normal to an extension direction of the first and second rails and parallel to the inner sides of the server rack.

According to another advantageous embodiment, the first rails are fixed to the rack server insert by means of holding points provided for the telescopic rails. Furthermore, the second rails are fixed to the server rack by means of holding points provided for the telescopic rails. The use of existing holding points, in particular threaded bores, used when mounting telescopic rails, comes with the advantage that existing rack server inserts and server racks can be used in conjunction with the rack installation carrier disclosed herein.

According to another advantageous embodiment, the rack server insert has a height of one height unit or of an integer multiple of the height unit.

Due to the fact that the rack server utilizes an entire height unit, maximum installation space is utilized within the chassis of the rack server insert. This is of particular importance for fans or plug-in cards, which can only hardly be accommodated in the flat chassis of the rack server insert.

According to another advantageous embodiment, a width of the holder corresponds to a width of a telescopic rail. This configuration allows equipping rack server inserts, which can be equipped with telescopic rails, with the rack installation carrier. The width of the holder includes the width of a first rail inserted in a second rail and of a second rail.

According to another advantageous embodiment, the first and/or second rails are each made of a metal material.

Metal materials are characterized by easy formability combined with high stability at the same time.

According to further advantageous embodiments, the first rails and/or second rails have an S-shaped profile. According to another advantageous design, the second rails have a U-shaped region. Shaping the rails in this way allows holding the rack server insert securely in the server rack.

According to another advantageous embodiment, the second rails do not extend into an installation space in which a chassis of the rack server insert is installed. If the rack installation carrier does not extend into the installation space, the rack server insert may utilize the entire height unit of the server rack. The chassis of the rack server insert may comprise a full height unit as a height, for example.

According to another advantageous embodiment, the first rail or the second rail of a holder has an opening and the respective other rail of this holder has a hook. The hook engages the opening when the rack server insert is completely inserted into the server rack. This way, a movement direction of the first rail perpendicular to the insert direction is limited, in particular blocked.

In this embodiment, the two rails are hooked in such a way that the first rail cannot derail from the second rail if the rack server insert is completely inserted into the server rack. This constitutes a transport protection and an earth quake protection, respectively.

BRIEF DESCRIPTION OF THE DRAWINGS

Embodiments are illustrated by way of example and not limited by the following figures.

FIG. 4b is a schematic illustration of a part of a rack server insert with a holder according to another embodiment of the invention.

DETAILED DESCRIPTION OF EXAMPLES OF EMBODIMENTS

Figure 1:
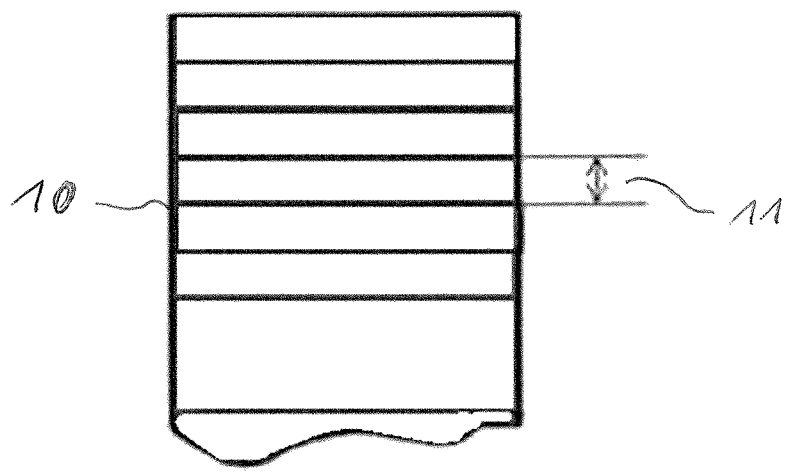
FIG. 1 is a schematic illustration of a server rack.
Figure 2:
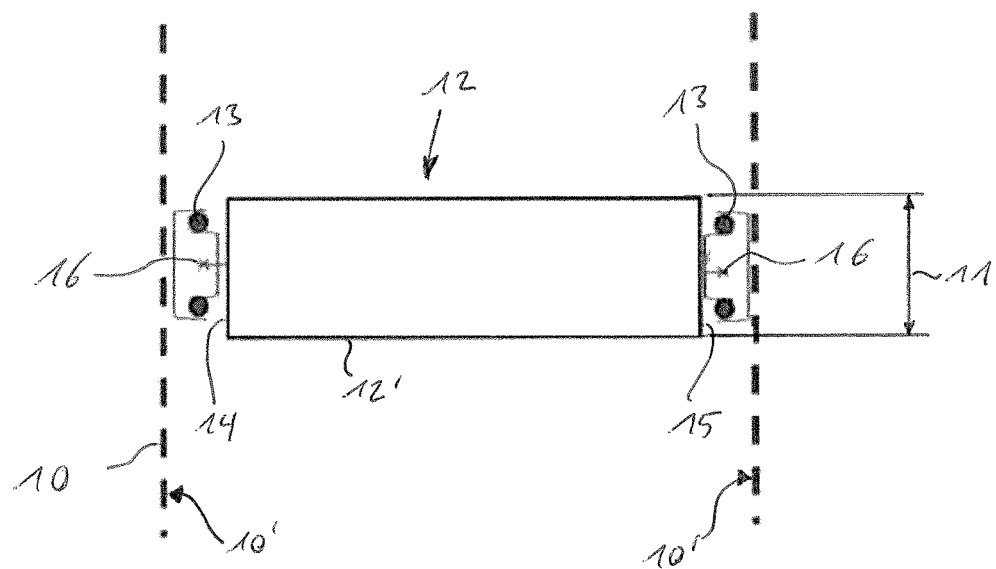
FIG. 2 is a schematic illustration of a known assembly of a rack server insert in a server rack.
Figure 3:
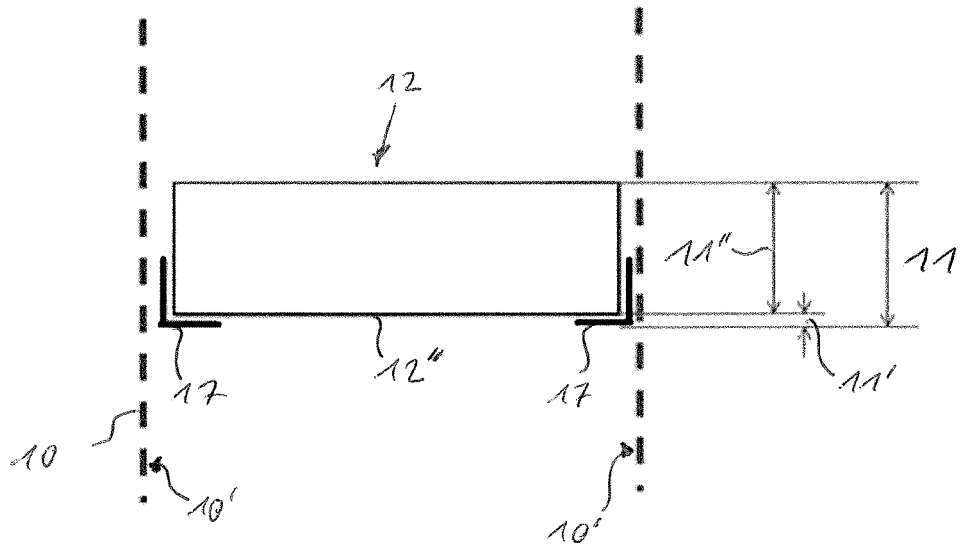
FIG. 3 is a schematic illustration of another known assembly of a rack server insert in a server rack.

Like or similar components are indicated with like reference numerals throughout the Figures. This is for the sake of clarity and shall not limit the invention.

Figure 4A:
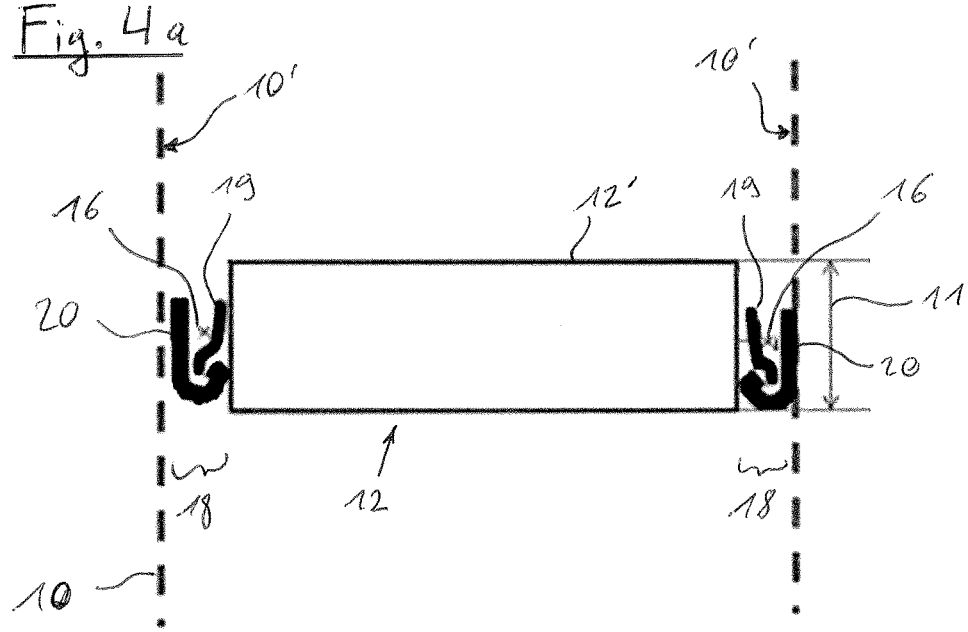
FIG. 4a is a schematic illustration of a rack server insert in a server rack with a rack installation carrier according to a first embodiment of the invention.

FIG. 4a shows a schematic illustration of an assembly according to an exemplary embodiment of the invention. Here, the inner sides 10' of server rack 10 are schematically illustrated by dashed lines. Illustration of further structural details of server rack 10 has been omitted for the sake of clarity.

FIG. 4a shows two holders 18 of a rack installation carrier. Here, the rack installation carrier does not protrude into the installation space. In particular, the holders 18 each have a total width which is narrow enough to fit between the installation space and the inner sides 10' of server rack 10.

The rack installation carrier comprises two holders 18. Each holder 18 comprises a first rail 19 and a second rail 20. The first rail 19 is fixed to the rack server insert 12. In the exemplary embodiment, the first rail 19 is screw-connected to the rack server insert 12. In particular, the first rail 19 is fixed to the narrow longitudinal outer sides of a chassis 12' of rack server insert 12. Viewed from a front of the chassis 12' of rack server insert 12, the first rails 19 are fixed to the left and right side of chassis 12'.

In the exemplary embodiment, rack server insert 12 comprises holding points 16 which are suitable for mounting telescopic rails 13. The first rails 19 are screwed to holding points 16 of rack server insert 12 with screws (not shown). Thus, new fixing points need not be provided on the rack server insert 12. This way, existing chassis 12' for rack server inserts 12 can be equipped this way as an alternative to mounting by telescopic rails 13 or mounting with the rack installation carrier according to embodiments of the invention.

In each case one second rail 20 is mounted on an inner side 10' of server rack 10. A second rail 20 is mounted on the server rack 10 for each holder 18. In the illustrated exemplary embodiment according to FIG. 4a, the second rails 20 each have a J-shaped profile.

For mounting the rack server insert 12 in the server rack 10, the rack server insert 12 with first rails 19 mounted is inserted into second rails 20 mounted in the server rack 10. In the exemplary embodiment, the rack server insert 12 is inserted into the server rack 10 with a rear side opposite the front side first ahead. Here, ends of the respective first rails 19 located on the rear side are each placed on the front edges of the second rails 20 directing to the front side of the server rack 10 and, subsequently, pushed into the server rack 10, with the two first rails 19 sliding backwards in the two second rails 20. The rails are directly sliding over the other, lubricating or greasing the rails is not required.

Holders 18, in particular first rails 19 and second rails 20, consist of a metal material. In particular, first rails 19 and second rails 20 consist of a steel sheet. Here, thickness of the steel sheet is selected such that holders 18 are capable of carrying the weight of rack server insert 12. The exemplary weight of 25 kg for rack server insert 12 is increased by the own weight of first rails 19, which have to be supported by the second rails 20 as well.

FIG. 4b shows an alternative embodiment of a holder 18 of a rack installation carrier. For the sakes of clarity, illustration of server rack 10 has been omitted.

Both the rack server insert 12 with chassis 12' and the first rail 19 correspond to the above-described embodiment according to FIG. 4a. The first rail 19 is fixed on holding points 16 on rack server insert 12. In this exemplary embodiment, however, the second rail 20 has the same S-shaped profile as the first rail 19. The interplay between first rail 19 and second rail 20 is described below in detail with reference to FIG. 5c.

FIGS. 5a to 5d show exemplary embodiments of profiles of holders 18.

Figure 5A:
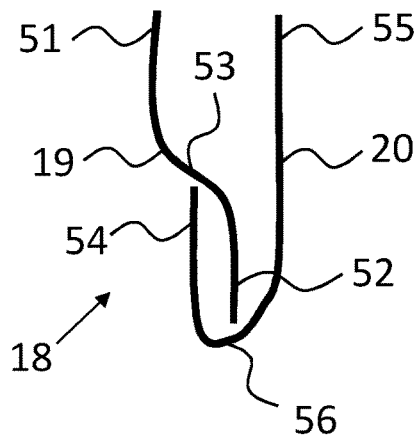
FIGS. 5a to 5d are schematic illustrations of profiles of first and second rails of a rack installation carrier according to different embodiments of the invention.

FIG. 5a schematically shows the profile of the first rail 19 and the second rail 20 of the holder 18 according to the exemplary embodiment described in FIG. 4. Hereinafter, a region of a profile of a rail that starts on a first edge of the rail and is directed toward the second edge is referred to as end. The ends of the rails are interconnected by means of at least one intermediate part.

The first rail 19 has a substantially S-shaped, curved profile. Here, a first end 51 and a second end 52 are interconnected by means of a curved intermediate part 53. The first rail 19 is fixedly screwed to the chassis 12' of the rack server insert 12 with its first end 51. The second rail 20 has an essentially J-shaped profile. Here, a first end 54 and a second end 55 are interconnected by an intermediate part 56 curved in a U-shape. Here, first end 54 is shorter than second end 55. The second rail 20 is fixedly screwed to the inner side 10' of the server rack 10 with the second end 55 thereof.

For holding the rack server insert 12, the first rail 19 and the second rail 20 interact in such a way that the second end 52 of the first rail 19 engages behind the first end 54 of second rail 20, thus engaging the lug formed by the first end 54, the intermediate curved part 56 and the second end 55. Here, either the intermediate part 53 of first rail 19 rests on the first end 54 of the second rail 20 or the second end 52 of the first rail 19 rests on the curved intermediate part 56 of the second rail 20. Just as well, both the intermediate part 53 of the first rail 19 may rest on the first end 54 of the second rail 20 and the second end 52 of the first rail 19 may rest on the curved intermediate part 56 of the second rail 20 at the same time.

The illustration of the profile of the first rail 19 and of the second rail 20 of holder 18 is to be understood as schematic illustration since, for example, the first end 54 and second end 52 of the two rails 20 and 19, respectively, may be bent or deformed. As such, the first end 54 of the second rail 20 may be bent away from the leg of the second end 55 of the second rail 20 on one end point, for example. As an alternative, the first end 54 of second rail 20 may comprise some type of barb or be bent inwards toward the second end 55 of the second rail 20 so that the first rail 19 rests on a larger area on the second rail 20 and a friction resistance of the first rail 19 in the second rail 20 is increased.

Figure 5B:
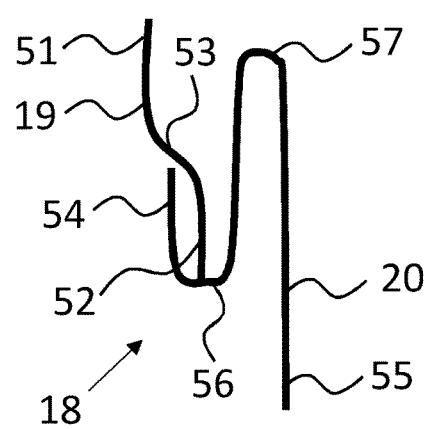

FIG. 5b shows another embodiment of a profile of a holder 18. Here, the profile of the first rail 19 is identical to the profile of the first rail 19 of the exemplary embodiment described in FIG. 5a. The second rail 20 is different from the second rail 20 of the exemplary embodiment of FIG. 5a in that another curvature 57 is formed between the second end 55 and the curved intermediate part 56. Here, said curvature 57 shapes the second end 55 by 180° in such a way that a leg of the second rail 20 between curvature 57 and curved intermediate part 56 runs parallel to the second end 55. The interplay between the first rail 19 and the second rail 20 behaves in the same way as described in FIG. 5a.

Figure 5C:
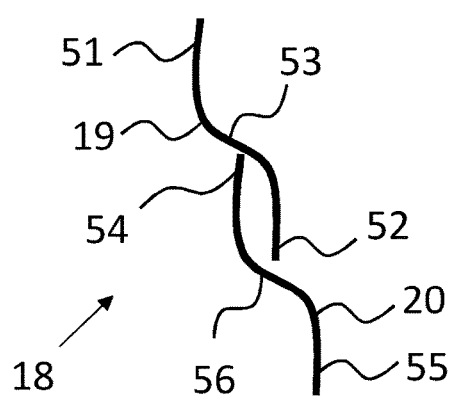

FIG. 5c shows another schematic profile illustration of a holder 18. Such a holder 18 is illustrated when mounted to the rack server insert 12 in the exemplary embodiment of FIG. 4b. In the exemplary embodiment according to FIG. 5c, the profile of the first rail 19 is identical to the profiles of the first rails 19 of the two exemplary embodiments according to FIGS. 5a and 5b.

In the exemplary embodiment according to FIG. 5c, the profile of the second rail 20 is designed to be identical to the profile of the first rail 19. The first end 54 is connected to the second end 55 via the intermediate part 56 so as to form an S-shaped profile. While the first rail 19 is fixedly screwed to the first end 51 on chassis 12' of the rack server insert 12, the second rail 20 is fixedly screwed to the second end 55 on the inner side 10' of the server rack 10.

The second rail 20 forms a pocket together with the server rack 10 (not shown here), said pocket being formed by the first end 54 and the intermediate part 56 as well as by the inner side 10' of server rack 10. The first rail 19, in particular the second end 52 thereof, is guided in said pocket. The support points correspond to the support points described with reference to FIG. 5a. By a limitation of the width of the chassis 12' of the rack server insert 12 as well as of the first rails 19, a distance is provided between the respective two second ends 52 of the two first rails 19 used for mounting the rack server insert 12. As a result, the first rails 19 do not slip off the second rails 20 in the direction of the second end 55 of the second rail 20.

Figure 5D:
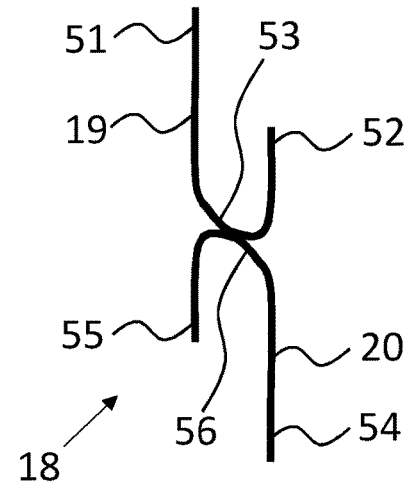

FIG. 5D shows another embodiment of profiles of the first rail 19 and second rail 20. In this embodiment, both rails 19 and 20 each have an identical profile. Both the first rail 19 and the second rail 20 have a J-shaped profile.

The respective longer one of the two legs ends in the first end 51 or 54, respectively. The respective shorter one of the two legs ends in the second end 52 or 55, respectively. In the interplay during insertion and while supporting the rack server insert 12, both rails 19 and 20 rest on one another with the respective curved intermediate parts 53 or 56, respectively. The first rail 19 is prevented from slipping off the second rail 20 by the inner side 10' of the server rack 10 and the side walls of the chassis 12' of rack server insert 12.

Here, the first rail 19 is fixedly screwed to chassis 12' of rack server insert 12 with the first end 51 thereof. The second rail 20 is fixedly screwed to the inner side 10' of the server rack 10 with the first end 54. In FIGS. 5d (and 5a -5c), illustration of chassis 12' of rack server insert 12 as well as illustration of server rack 10 has been omitted.

Figure 6:
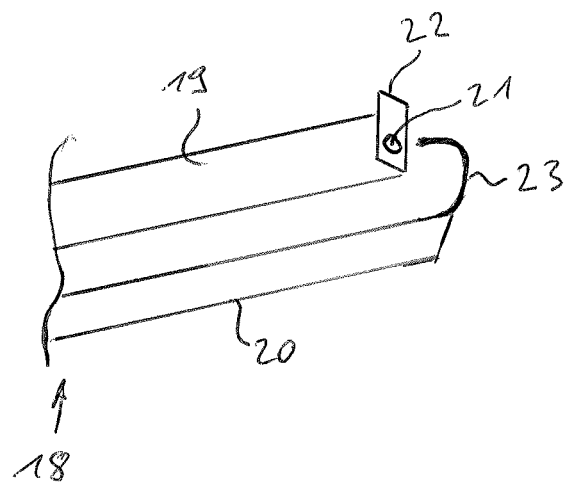
FIG. 6 is a schematic illustration of a holder according to an embodiment of the invention.
Figure 7:
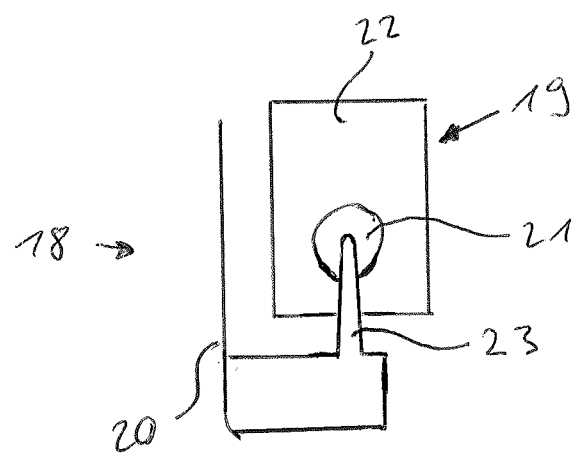
FIG. 7 depicts another schematic illustration of the holder.

FIG. 6 and FIG. 7 show different perspectives of a schematic illustration of a rear end of a holder 18 according to another embodiment. In the mounted state, the rear end 14 is opposite a front side of the server rack 10. For the sake of clarity, illustration of curved profiles of first rail 19 and second rail 20 has been omitted. Rather, profiles of the first rail 19 and of the second rail 20 are shown without curvature. However, this shall not limit the type of profiles of the first rail 19 and the second rail 20.

The first rail 19 has an opening 21. In the exemplary embodiment, opening 21 is arranged in an angled end piece 22 of the first rail 19. In another embodiment, opening 21 can be arranged in an angled piece welded thereto. The opening 21 is a bore hole. In another design, opening 21 is a notch-like recess in the first rail 19.

The second rail 20 comprises a hook 23. Said hook 23 is designed as a bent mandrel protruding from the end of the second rail 20 opposite the front side of the server rack 10 and bent by 180° toward the front side of the server rack 10. Length and curvature radius of hook 23 are selected such that said hook engages in the opening 21 when the rack server insert 12 and the first rail 19 fixed thereon are completely inserted in server rack 10. In other exemplary embodiments, the hook 23 is a screw, a bolt or a comparative protrusion which is capable of engaging in the opening 21.

In the exemplary embodiment, hook 23 is formed of an extension of the second rail 20. In a further exemplary embodiment, hook 23 is placed onto the second rail 20 directly or by means of a stop and connected to the second rail 20 by means of a weld connection, screw connection or another method in a positive or non-positive connection.

As soon as the rack server insert 12 is completely inserted into the server rack 10, hook 23 engages in the opening 21 and thus blocks movement of the first rail 10 relative to the second rail 20 normal to the insertion direction of the rack server insert 12 or limits said movement at least to such extent that the first rail 19 cannot derail from the second rail 20. The rack server insert 12 is screwed to the front of the server rack 10 or fixed in another positive connection. As a result, the first rail 19 cannot derail from the second rail 20 since the first rail is secured at the front side by the screw connection of rack server insert 12 and the server rack 10 and on the side opposite the front side by the hook 23 engaging in the opening 21.

In another exemplary embodiment, the opening 21 and the hook 23 may of course also be arranged on the respective other rail.

Examples of embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made therein without departing from the spirit and scope of the present invention as set forth in the claims.

LIST OF REFERENCE NUMERALS 10 server rack
10' inner side
11 height unit
11' material thickness
11" height
12 rack server insert
12', 12" chassis
13 telescopic rail
14 first side of rack server insert
15 second side of rack server insert
16 holding point
17 L-angle
18 holder
19 first rail
20 second rail
21 opening
22 end part
23 hook
51, 54 first end
52, 55 second end
53, 56 intermediate part
57 curvature

The invention claimed is:

1. Assembly, comprising
a rack server insert,
a server rack for accommodating multiple rack server inserts,
and a rack installation carrier for supporting the rack server insert in the server rack, wherein the rack server insert is set up to be supported by telescopic rails in the server rack and wherein the rack installation carrier comprises two holders each having a first rail fixed to the rack server insert and each having a second rail fixed to the server rack, wherein the first rails freely and directly rest on the second rails so that the rack server insert is supported in the server rack and the rack installation carrier is free in the extension direction of the first rails as well as the second rails and free in a spatial direction that counteracts gravity.

2. Assembly according to claim 1, wherein an overall height of a first rail laid onto a second rail together with the second rail is less than a height unit of a server rack.

3. Assembly according to claim 1, wherein the first rails are fixed to the rack server insert by means of holding points provided for the telescopic rails and wherein the second rails are fixed to the server rack by means of holding points provided for the telescopic rails.

4. Assembly according to claim 1, wherein the rack server insert has a height of a height unit or of an integral multiple of a height unit.

5. Assembly according to claim 1, wherein a width of a holder corresponds to a width of a telescopic rail.

6. Assembly according to claim 1, wherein the first rails and/or the second rails are made of a metal material.

7. Assembly according to claim 1, wherein the first rails have an S-shaped profile.

8. Assembly according to claim 1, wherein a profile of the second rails has a U-shaped region.

9. Assembly according to claim 1, wherein the second rails have an S-shaped profile.

10. Assembly according to claim 1, wherein the second do not extend into an installation space in which a chassis of the rack server insert is installed.

11. Assembly according to claim 1, wherein the first rail or the second rail of a holder has an opening and the respective other one of the two rails of said holder has a hook, wherein the hook engages in the opening when the rack server insert is entirely pushed into the server rack in order to restrict, in particular block, a movement direction of the first rail perpendicular to an insertion direction of the rack server insert.

* * * * *